(12) United States Patent
Masuda

(10) Patent No.: US 7,050,119 B2
(45) Date of Patent: May 23, 2006

(54) DIGITAL/ANALOG COMMON TUNER

(75) Inventor: Shigeto Masuda, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 559 days.

(21) Appl. No.: 10/336,019

(22) Filed: Jan. 3, 2003

(65) Prior Publication Data

US 2003/0128303 A1 Jul. 10, 2003

(30) Foreign Application Priority Data

Jan. 4, 2002 (JP) ............................. 2002-000135

(51) Int. Cl.
*H04N 5/50* (2006.01)

(52) U.S. Cl. ..................... 348/731; 348/726; 348/735

(58) Field of Classification Search ........ 348/731–733, 348/725–729, 735, 554, 820, 836; 455/190.1, 455/191.1, 191.3, 192.1, 192.2, 192.3, 313–316, 455/318, 319, 323, 347, 300, 301; 375/316, 375/324, 327, 328, 340, 344, 345, 349, 352; H04N 5/50, H04N 5/44

See application file for complete search history.

(56) References Cited

U.S. PATENT DOCUMENTS 6,016,170 A * 1/2000 Takayama et al. .......... 348/731
6,343,209 B1 * 1/2002 Maeda et al. ............... 348/731
6,757,029 B1 * 6/2004 Kurihara .................... 348/731

FOREIGN PATENT DOCUMENTS

| JP | 8-181556 A | 7/1996 |
| JP | 10-242883 | 9/1998 |
| JP | 11-341375 | 12/1999 |
| JP | 2001-044870 | 2/2001 |
| JP | 2002-000135 | 7/2004 |

* cited by examiner

*Primary Examiner*—Sherrie Hsia
(74) *Attorney, Agent, or Firm*—Birch, Stewart, Kolasch & Birch, LLP

(57) ABSTRACT

Circuits and buses directed to analog signal processing are accommodated in a cabinet functioning as an electromagnetic shielding. Circuits and buses directed to digital signal processing are disposed outside the cabinet. In order to minimize generation of noise from the bus through which digital data is transmitted, a microprocessor combines a plurality of signals and data as digital data for output onto a bus from one I/O port. A decoder that receives and separates the combined data is provided in the cabinet. Data is transferred between the microprocessor and the decoder through one bus. As a result, a digital/analog common tuner has the influence of noise generated from a digital signal processing system on the analog signal processing system suppressed, improving the reception properties.

20 Claims, 8 Drawing Sheets

DIGITAL/ANALOG COMMON TUNER

BACKGROUND OF THE INVENTION

1. Field of the Invention

The present invention relates to a digital/analog common tuner that can selectively receive digital-modulated television signals and analog-modulated television signals.

2. Description of the Background Art

In the field of broadcasting where the development and use of digitalization continues to advance, analog broadcasting and digital broadcasting are now both available. The demand for a common tuner that can receive both analog/digital broadcast signals has become higher.

The digital broadcast now on air has a channel band identical to that of the conventional analog broadcast (for example, broadcast by the NTSC (National Television System Committee) mode). Therefore, the procedure starting from reception of a signal up to frequency conversion into an intermediate-frequency signal (hereinafter referred to as "IF signal") can be implemented with one tuner.

FIG. 8 is a functional block diagram to describe the function of the front end (generally represents the operation from signal reception up to demodulation) of a conventional digital/analog common tuner. The digital/analog common tuner 200 shown in FIG. 8 employs the double conversion scheme.

According to the double conversion scheme, the input RF (Radio Frequency) signal is first up-converted into a signal of high frequency (for example, approximately 1200 MHz), and then down-converted into a desired IF signal. The double conversion scheme is advantageous in that superior and stable reception properties can be achieved.

Referring to FIG. 8, digital/analog common tuner 200 includes an RF signal input terminal 201, an RF gain control circuit 202, a first frequency conversion unit with a mixer circuit 203, a local oscillator 204 and a PLL circuit 205, a second frequency conversion unit with a mixer circuit 206, a local oscillator 207 and a PLL circuit 208, and an IF signal output terminal 209. These circuits are accommodated in one cabinet 250 that is shielded electromagnetically.

Digital/analog common tuner 200 further includes an IF signal distribution circuit 211, an analog demodulation unit with an IF-AGC circuit 212, an analog demodulation circuit 213 and an AGC detector circuit 214, a digital demodulation unit with an IF-AGC circuit 215, an A/D converter 216, a digital demodulation circuit 217 and an AGC detector circuit 218, and RF gain control signal buses 219 and 220.

Digital/analog common tuner 200 further includes an RF gain control signal switching circuit 221, a microprocessor 222, a PLL set bus 223, and an RF gain switching signal bus 224.

Digital/analog common tuner 200 additionally includes terminals 225 and 226 to apply respective data and signals on PLL set bus 223 and RF gain switching signal bus 224 into cabinet 250, bandpass filters 231–236 to apply band-filtering at appropriate sites between each of the above-described circuits, and amplifier circuits 237–239 amplifying the level of the signals.

Bandpass filters 231–234 and amplifier circuits 237–239 are also accommodated in cabinet 250.

The operation of digital/analog common tuner 200 will be described schematically here. The RF signal input to RF signal input terminal 201 and filtered by bandpass filter 231 is adjusted to a predetermined signal level by RF gain control circuit 202. The RF signal is amplified by a predetermined level by amplifier circuit 237, and then mixed by mixer circuit 203 of the first frequency conversion unit with a local oscillator signal output from local oscillator 204 under control of PLL circuit 205 to be converted into a first IF signal higher in frequency than the desired IF signal. The first IF signal is filtered by bandpass filter 232, amplified by amplifier circuit 238, filtered again by bandpass filter 233, and then mixed by mixer circuit 206 of the second frequency conversion unit with a local oscillator signal output from local oscillator 207 under control of PLL circuit 208 to be frequency-converted into the desired IF signal. The IF signal is filtered by bandpass filter 234 and amplified by a predetermined level through amplifier circuit 239 to be output to IF signal output terminal 209.

The frequency set data required to convert the frequencies of the first IF signal and the desired IF signal is output from microprocessor 222 onto a PLL set bus 223, and then input into cabinet 250 through terminal 225 to be set at PLL circuits 205 and 208.

The IF signal output from IF signal output terminal 209 is distributed to the system that performs analog demodulation processing and the system that performs digital demodulation processing by an IF signal distribution circuit 211.

In the case of analog broadcast reception, the IF signal is filtered by bandpass filter 235, adjusted to a predetermined signal level by IF-AGC circuit 212, and then demodulated by analog demodulation circuit 213. At this stage, AGC detector circuit 214 provides to IF-AGC circuit 212 a control signal that controls the gain of IF-AGC circuit 212 so that appropriate analog-demodulation is effected, and also outputs, at an RF signal stage, an RF gain control signal onto RF gain control signal bus 219 to control the gain at RF gain control circuit 202.

The RF gain control signal on RF gain control signal bus 219 is provided to RF gain control circuit 202 via RF gain control signal switching circuit 221. At this stage, RF gain control signal switching circuit 221 responds to an RF gain switching signal received from microprocessor 222 via RF gain switching signal bus 224 to select and provide to RF gain control circuit 202 the gain control signal from RF gain control signal bus 219 or 220. Since determination of analog broadcast reception is already made by microprocessor 222 based on the reception channel, and an RF gain switching signal designating selection of RF gain control signal bus 219 is output from microprocessor 222 onto RF gain switching signal bus 224, RF gain control signal switching circuit 221 selects RF gain control signal bus 219 to output the RF gain control signal from AGC detector circuit 214 of the analog demodulation system to RF gain control circuit 202.

In the case of digital broadcast reception, the IF signal is filtered by bandpass filter 236, adjusted to a predetermined level by IF-AGC circuit 215, and then converted into a digital signal by A/D converter 216 to be demodulated by digital demodulation circuit 217. At this stage, AGC detector circuit 218 outputs to IF-AGC circuit 215 a control signal adjusting the gain of IF-AGC circuit 215 so that appropriate digital demodulation is conducted, and also outputs, at the RF signal stage, an RF gain control signal onto RF gain control signal bus 220 to control the gain of RF gain control circuit 202.

The RF gain control signal onto RF gain control signal bus 220 is provided to RF gain control circuit 202 via RF gain control signal switching circuit 221. Since determination of digital broadcast reception is already made by microprocessor 222 based on the reception channel, and an RF gain switching signal designating selection of RF gain control signal bus 220 is output onto RF gain switching signal bus 224 from microprocessor 222, RF gain control signal switching circuit 221 selects RF gain control signal bus 220 to output the RF gain control signal from AGC detector circuit 218 of the digital demodulation system to RF gain control circuit 202.

In digital/analog common tuner 200, IF signal distribution circuit 211 as well as bandpass filter 235, IF-AGC circuit 212, analog demodulation circuit 213 and AGC detector circuit 214 corresponding to the system of analog demodulation processing are circuits that process an analog signal. The signals handled by bandpass filter 236 and IF-AGC circuit 215 of the system that performs digital demodulation processing are also analog signals. Furthermore, RF gain control signal buses 219 and 220 handle analog signals.

In contrast, A/D converter 216, digital demodulation circuit 217, AGC detector circuit 218 and microprocessor 222 are circuits that process digital signals.

Since these circuits are disposed on the same substrate, the analog signal processing circuit vulnerable to noise in digital/analog common tuner 200 will be affected by the noise from the digital signal processing circuit. As a result, various problems such as degradation in the S/N ratio occur.

In a common tuner such as digital/analog common tuner 200, PLL frequency set data used to convert the frequency of a signal and a switching signal used to switch the circuit attribute depending upon the reception of either digital or analog broadcast must be set at predetermined circuits from microprocessor 222. In conventional digital/analog common tuner 200, microprocessor 222 outputs the aforementioned PLL frequency set data and switching signal separately from two I/O ports. However, the requirement of two I/O ports will restrict the microprocessor that can be adopted. If an additional switching signal is required to induce the necessity of more I/O ports, the selection of the microprocessor will be further restricted. This becomes a factor in increasing the cost of the microprocessor.

If the number of buses is increased according to the additionally required I/O ports, restriction will be imposed on the layout on the substrate. Also, the noise generated from the bus through which a digital signal is transmitted may adversely affect the performance of the tuner. Therefore, it is desirable to keep the number of buses as low as possible.

SUMMARY OF THE INVENTION

In view of the foregoing, an object of the present invention is to provide a digital/analog common tuner that has the influence of noise generated from the digital signal processing system onto the analog signal processing system suppressed to improve the reception properties.

Another object of the present invention is to provide a digital/analog common tuner that can have the restriction imposed on the microprocessor dismissed to eliminate any increase in cost or restriction in design caused by the restriction on the microprocessor.

According to an aspect of the present invention, a digital/analog common tuner can receive both a first television signal modulated digitally and a second television signal modulated analogically. The digital/analog common tuner includes a frequency conversion circuit frequency-converting an input signal into an intermediate frequency signal, a digital demodulation processing circuit converting into a digital signal a first intermediate frequency signal that is a frequency-converted version of the first television signal by the frequency conversion circuit and demodulating the digital signal, and an analog demodulation processing circuit demodulating a second intermediate frequency signal that is a frequency-converted version of the second television signal by the frequency conversion circuit. The frequency conversion circuit and analog demodulation processing circuit are accommodated in a cabinet functioning as an electromagnetic shield.

According to another aspect of the present invention, a digital/analog common tuner that can receive both a first television signal modulated digitally and a second television signal modulated analogically includes a frequency conversion circuit frequency-converting an input signal into an intermediate frequency signal, an input signal gain control circuit controlling the gain based on either a first gain control signal used when the input signal is the first television signal or a second gain control signal used when the input signal is a second television signal, a gain control signal switching circuit receiving a first gain control signal and a second gain control signal either the first or second gain control signal to output to the input signal gain control circuit, a control circuit combining a gain switching signal used to switch between the first gain control signal and the second gain control signal with frequency set data used to frequency-convert an input signal into an intermediate frequency signal at the frequency conversion circuit for output as digital data, a bus through which data combined by the control circuit for output is transmitted, and a decoder receiving and separating the combined data into a gain switching signal and frequency set data to output the gain switching signal to the gain control signal switching circuit and to output the frequency set data to the frequency conversion circuit.

Preferably, the digital/analog common tuner further includes an input signal gain control circuit controlling the gain based on either a first gain control signal output from the analog demodulation processing circuit or a second gain control signal output from the digital demodulation processing circuit, a gain control signal switching circuit receiving first and second gain control signals and selecting either the first or second gain control signal to output to the input signal gain control signal, a control circuit combining a gain switching signal used to switch between the first and second gain control signals with frequency set data used to frequency-convert the input signal into the intermediate frequency signal at the frequency conversion circuit to output as digital data, a bus through which the data combined by the control circuit for output is transmitted, and a decoder receiving and separating the combined data into the gain switching signal and the frequency set data to provide the gain switching signal to the gain control signal switching circuit and to output the frequency set data to the frequency conversion circuit. The input signal gain control circuit, the gain control signal switching circuit and the decoder are accommodated in the cabinet.

Preferably, the digital/analog common tuner further includes a signal switching circuit that selectively provides the intermediate frequency signal converted by the frequency conversion circuit to either the digital demodulation processing circuit or analog demodulation processing circuit. The signal switching circuit is accommodated in the cabinet.

Preferably, the digital/analog common tuner further includes an input signal gain control circuit controlling a gain based on either a first gain control signal output from the analog demodulation processing circuit or a second gain control signal output from the digital demodulation processing circuit, a gain control signal switching circuit receiving first and second gain control signals and selecting either the first or second gain control signal to output to the input signal gain control circuit, a control circuit combining a gain switching signal used to switch between the first and second gain control signals, frequency set data used to frequency-convert the input signal into the intermediate frequency signal at the frequency conversion circuit, and an IF switching signal used to switch a transmission destination at the signal switching circuit for output as digital data, a bus through which the data combined by the control circuit for output is transmitted, and a decoder receiving and separating the combined data into the gain switching signal, the frequency set data, and the IF switching signal to output the gain switching signal to the gain control signal switching circuit, to output the frequency set data to the frequency conversion circuit, and to output the IF switching signal to the signal switching circuit. The input signal gain control circuit, the gain control signal switching circuit, and the decoder are also accommodated in the cabinet.

Preferably, the frequency conversion circuit includes a local oscillator generating a local oscillator signal, a PLL circuit controlling the local oscillator based on frequency set data, and a mixer circuit mixing the input signal with the local oscillator signal to frequency-convert into the intermediate frequency signal.

Preferably, the decoder and gain control signal switching circuit are disposed in the proximity of the frequency conversion circuit.

Preferably, the frequency conversion circuit includes a first frequency conversion circuit converting the input signal into a predetermined frequency signal, and a second frequency conversion circuit converting the predetermined frequency signal into an intermediate frequency signal.

Preferably, the frequency conversion circuit includes a first frequency conversion circuit converting the input signal into a predetermined frequency signal, and a second frequency conversion circuit converting the predetermined frequency signal into the intermediate frequency signal. The frequency set data output from the control circuit includes first frequency set data used to frequency-convert the input signal into the predetermined frequency signal, and second frequency set data used to frequency-convert the predetermined frequency signal into the intermediate frequency signal. The decoder further separates the combined data into first and second frequency set data. The first frequency set data is provided to the first frequency conversion circuit. The second frequency set data is provided to the second frequency conversion circuit.

Preferably, the decoder and the gain control signal switching circuit are disposed in the proximity of either the first or second frequency conversion circuit.

Preferably, the frequency conversion circuit includes a first frequency conversion circuit converting the input signal into a predetermined frequency signal, and a second frequency conversion circuit converting the predetermined frequency signal into the intermediate frequency signal. The frequency set data output from the control circuit includes first frequency set data used to frequency-convert the input signal into the predetermined frequency signal, and second frequency set data used to frequency-convert the predetermined frequency signal into the intermediate frequency signal. The decoder includes a first decoder disposed in the proximity of a first PLL circuit included in the first frequency conversion circuit, and a second decoder disposed in the proximity of a second PLL circuit included in the second frequency conversion circuit. The first decoder separates the combined data received from the bus into the first frequency set data and gain control signal to output the first frequency set data to the first PLL circuit and to output the gain switching signal to the gain control signal switching circuit. The second decoder separates the combined data received from the bus into the first frequency set data and the IF switching signal to output the second frequency set data to the second PLL circuit and to output the IF switching signal to the signal switching circuit.

According to the digital/analog common tuner of the present invention, the analog signal process related circuit and bus through which an analog signal is transmitted, vulnerable to noise, are electromagnetically shielded from the digital signal process related circuit and bus through which a digital signal is transmitted. Therefore, degradation in the S/N ratio related to analog signal processing, caused by noise generated from the digital signal process related circuit and bus through which a digital signal is transmitted, can be suppressed. Stable reception properties can be achieved.

According to the digital/analog common tuner of the present invention, the signal and data transmitted from the microprocessor are combined into one data and transmitted through one bus. Therefore, only one I/O port for the microprocessor is necessary. Restriction on the microprocessor such as adopting a microprocessor with a plurality of I/O ports can be eliminated. Therefore, the increase in cost of the microprocessor can be suppressed. Also, reduction in the number of buses provides the advantage of reducing the noise generation source as well as reducing the design cost by simplifying the circuit design.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
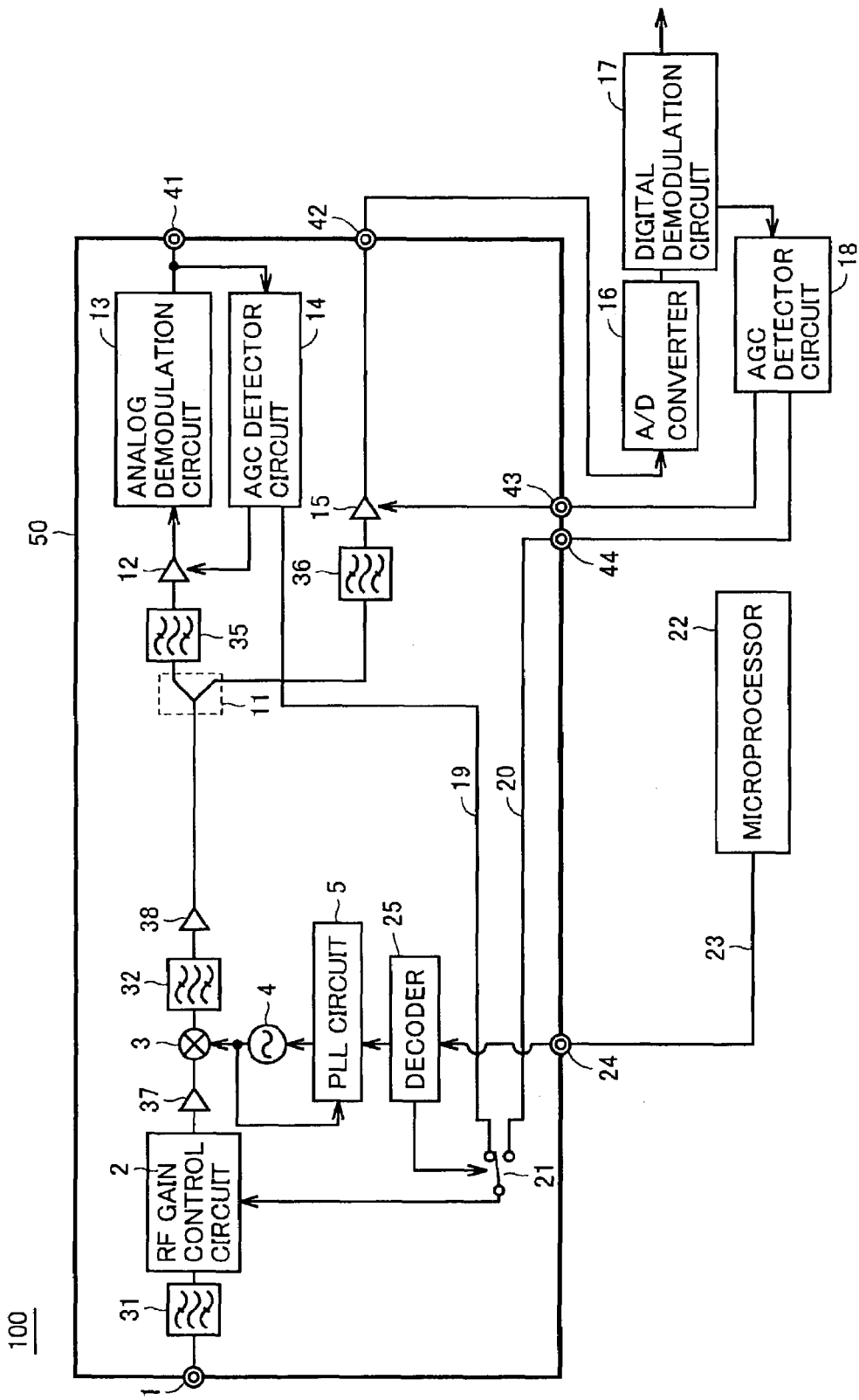
FIG. 1 is a functional block diagram to describe the function of a digital/analog common tuner according to a first embodiment of the present invention.

Embodiments of the present invention will be described in detail with reference to the drawings. In the drawings, the same or corresponding elements have the same reference characters allotted, and description thereof will not be repeated.

First Embodiment

Referring to FIG. 1, a digital/analog common tuner 100 according to a first embodiment includes an RF signal input terminal 1, an RF gain control circuit 2, a mixer circuit 3, a local oscillator 4, and a PLL circuit 5. These circuits are directed to the process of receiving an RF signal for conversion into an IF signal.

Digital/analog common tuner 100 further includes an IF signal distribution circuit 11 distributing an IF signal to an analog demodulation system and a digital demodulation system.

Additionally, digital/analog common tuner 100 further includes a bandpass filter 35, an IF-AGC circuit 12, an analog demodulation circuit 13, and an AGC detector circuit 14. These circuits are directed to the process of demodulating an analog-modulated IF signal.

Digital/analog common tuner 100 further includes a bandpass filter 36, an IF-AGC circuit 15, an A/D converter 16, a digital demodulation circuit 17, and an AGC detector circuit 18. These circuits are directed to the process of demodulating a digital-modulated IF signal.

Additionally, digital/analog common tuner 100 further includes RF gain control signal buses 19 and 20.

Digital/analog common tuner 100 also includes an RF gain control signal switching circuit 21, a microprocessor 22, a bus 23, and a decoder 25. This circuit group and bus are related to the process of switching the circuit attribute of digital/analog common tuner 100 according to the reception channel and type of the received RF signal.

Further additionally, digital/analog common tuner 100 includes RF gain control signal buses 19 and 20, terminals 24 and 41–44, bandpass filters 31, 32, 35, 36, and amplifier circuits 37 and 38.

RF signal input terminal 1 is the terminal to input an RF signal to digital/analog common tuner 100.

RF gain control circuit 2 is a circuit that controls the input RF signal to a predetermined signal level based on an RF gain control signal received from AGC detector circuits 14 and 18 that will be described afterwards via RF gain control signal buses 19 and 20.

Mixer circuit 3, local oscillator 4 and PLL circuit 5 are circuits that frequency-convert an RF signal into an IF signal. Mixer circuit 3 mixes an RF signal with a local oscillator signal output from local oscillator 4 for frequency-conversion into an IF signal. Local oscillator 4 is under control of PLL circuit 5 to output a local oscillator signal to mixer circuit 3. The output local oscillator signal is fed back to PLL circuit 5. PLL circuit 5 is set by microprocessor 22 that will be described afterwards depending on the reception channel to control local oscillator 4 based on the set frequency received from microprocessor 22 via bus 23 and terminal 24.

IF signal distribution circuit 11 distributes the IF signal to the system of analog demodulation and to the system of digital demodulation.

IF-AGC circuit 12, analog demodulation circuit 13 and AGC detector circuit 14 are circuits to demodulate an analog-modulated IF signal. IF-AGC circuit 12 adjusts the IF signal to a predetermined level based on a control signal from AGC detector circuit 14. Analog demodulation circuit 13 demodulates an analog-modulated IF signal. AGC detector circuit 14 detects the signal level of the demodulated analog signal output from analog demodulation circuit 13 and controls IF-AGC circuit 12 such that the signal attains a predetermined level. AGC detector circuit 14 also outputs onto RF gain control signal bus 19 an RF gain control signal to control the gain of RF gain control circuit 2 based on the detected signal level.

IF-AGC circuit 15, A/D converter 16, digital demodulation circuit 17 and AGC detector circuit 18 are circuits to demodulate a digital-modulated IF signal. IF-AGC circuit 15 adjusts an IF signal to a predetermined level based on the control signal received from AGC detector circuit 18. A/D converter 16 converts an analog IF signal into an digital signal. Digital demodulation circuit 17 demodulates a digital-modulated IF signal. AGC detector circuit 18 detects the level of the demodulated digital signal output from digital demodulation circuit 17 and controls IF-AGC circuit 15 such that the signal attains a predetermined level. AGC detector circuit 18 also outputs onto RF gain control signal bus 20 an RF gain control signal to control the gain of RF gain control circuit 2 based on the detected signal level.

RF gain control signal switching circuit 21 selects and provides to RF gain control circuit 2 the signal on either RF gain control signal bus 19 or RF gain control signal bus 20 based on the RF gain switching signal output from decoder 25 that will be described afterwards. Specifically, when the received RF signal is analog-demodulated, RF gain control signal switching circuit 21 provides the signal on RF gain control signal bus 19 to RF gain control circuit 2. When the received RF signal is digital-demodulated, RF gain control signal switching circuit 21 provides the signal on RF gain control signal bus 20 to RF gain control circuit 2.

Microprocessor 22 switches between digital signal processing and analog signal processing and sets the frequency to convert an RF signal into an IF signal according to the reception channel. Microprocessor 22 determines whether the broadcast is an analog broadcast or digital broadcast depending on the reception channel, and outputs an RF gain switching signal to switch the signal to RF gain switching circuit 21. In order to convert the received RF signal into a predetermined IF signal, microprocessor 22 outputs PLL frequency set data to be set at PLL circuit 5 according to the reception channel.

In digital/analog common tuner 100 of the first embodiment, the RF gain switching signal and PLL frequency set data are combined into one data for output from microprocessor 22. The combined data is output onto bus 23 from one I/O port of microprocessor 22.

Figure 2:
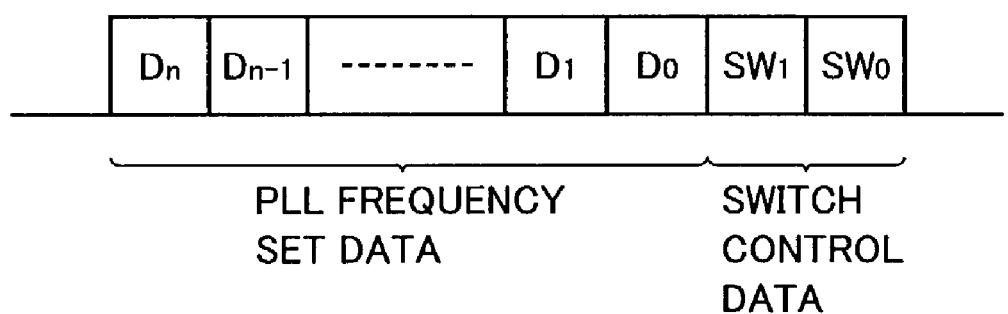
FIG. 2 shows a structure of data output from a microprocessor onto a bus in the digital/analog common tuner of FIG. 1.

FIG. 2 shows a structure of such combined data output from microprocessor 22 onto bus 23. Referring to FIG. 2, the PLL frequency set data that is set at PLL circuit 5 is located in the region indicated by D0-Dn. An RF gain switching signal is set in the region of SW0 or SW1. According to the data structure shown in FIG. 2, 2 bits, i.e. SW0 and SW1 are provided for the switch control data. If the switching signal is only one RF gain switching signal as in digital/analog common tuner 100 of the first embodiment, one bit is suffice for the switch control data.

Referring to FIG. 1 again, decoder 25 receives the above-described combined data via bus 23 and terminal 24 to separate the combined data into an RF gain switching signal and PLL frequency set data. Decoder 25 provides the RF gain switching signal to RF gain control signal switching circuit 21 and the PLL frequency set data to PLL circuit 5.

It is to be noted that decoder 25, PLL circuit 5 and RF gain control signal switching circuit 21 are arranged close to each other. By minimizing the length of the signal lines of respective signals output from decoder 25, the influence on a signal line from other circuits as well as the influence from a signal of other circuits can be suppressed as low as possible.

Bandpass filters 31, 32, 35 and 36 are signal filters that pass only a predetermined frequency band for the purpose of removing the noise component overlapped on the signal.

Amplifier circuits 37 and 38 amplify a signal by a predetermined level for output.

In digital/analog common tuner 100 of the first embodiment, respective circuits related to frequency conversion from RF signal input terminal 1 to amplifier circuit 38 as well as other circuits processing an analog signal are accommodated in cabinet 50. Specifically, bandpass filter 31, RF gain control circuit 2, amplifier circuit 37, mixer circuit 3, local oscillator 4, PLL circuit 5, bandpass filter 32 and amplifier 38 related to frequency conversion, IF signal distribution circuit 11, bandpass filter 35, IF-AGC circuit 12, analog modulation circuit 13 and AGC detector circuit 14 related to analog demodulation, bandpass filter 36 and IF-AGC circuit 15 processing an analog signal in a digital demodulation system, RF gain control signal buses 19 and 20, RF gain control signal switching circuit 21, and decoder 25 are accommodated in cabinet 50.

By electromagnetic shielding, cabinet 50 blocks out any effect of noise from circuits and buses outside cabinet 50. Thus, the S/N ratio in respective circuits related to analog processing, vulnerable to noise, can be improved.

In digital/analog common tuner 100, an RF signal input through RF signal input terminal 1 and filtered by bandpass filter 31 is adjusted to a predetermined level by RF gain control circuit 2. The RF signal is amplified by a predetermined level by amplifier circuit 37 and then mixed by mixer circuit 3 with a local oscillator signal output from local oscillator 4 under control of PLL circuit 5 to be converted into an IF signal. Then, the IF signal is filtered by bandpass filter 32 and amplified by amplifier circuit 38.

The PLL frequency set data used to convert an RF signal into an IF signal is output from microprocessor 22 onto bus 23 and fetched into cabinet 50 through terminal 24 to be applied to decoder 25. Then, the PLL frequency set data is output by decoder 25 to be set at PLL circuit 5.

The IF signal amplified by amplifier circuit 38 is distributed among the system that performs analog demodulation processing and the system that performs digital demodulation processing by IF signal distribution circuit 11.

In the case of analog broadcast reception, the IF signal is filtered by bandpass filter 35, adjusted to a predetermined level by IF-AGC circuit 12, and then demodulated by analog demodulation circuit 13. AGC detector circuit 14 outputs to IF-AGC circuit 12 a control signal that controls the gain of IF-AGC circuit 12 so that appropriate analog demodulation is carried out, and also outputs, at an RF signal stage, an RF gain control signal onto RF gain control signal bus 19 to control the gain of RF gain control circuit 2.

The RF gain control signal output onto RF gain control signal bus 19 is provided to RF gain control circuit 2 via RF gain control signal switching circuit 21. RF gain control signal switching circuit 21 selects and provides to RF gain control circuit 2 the gain control signal on either RF gain control signal bus 19 or 20 based on the RF gain switching signal from decoder 25. Since determination of analog broadcast reception is already made by microprocessor 22 according to the reception channel, an RF gain switching signal designating selection of RF gain control signal bus 19 is combined with PLL frequency set data to be output from microprocessor 22 to bus 23. At decoder 25, the RF gain switching signal is separated to be output to RF gain control signal switching circuit 21. RF gain control signal switching circuit 21 selects RF gain control signal bus 19 to output the RF gain control signal from AGC detector circuit 14 related to analog demodulation to RF gain control circuit 2.

In the case of digital broadcast reception, the IF signal is filtered by bandpass filter 36, adjusted to a predetermined level by IF-AGC circuit 15, converted into a digital signal by A/D converter 16, and demodulated by digital demodulation circuit 17. AGC detector circuit 18 outputs to IF-AGC circuit 15 a control signal to control the gain of IF-AGC circuit 15 so that appropriate digital demodulation is conducted, and also outputs, at an RF signal stage, an RF gain control signal onto RF gain control signal bus 20 to control the gain of RF gain control circuit 2.

The RF gain control signal output onto RF gain control signal bus 20 is provided to RF gain control circuit 2 via RF gain control signal switching circuit 21. Since determination of digital broadcast reception is already made by microprocessor 22 according to the reception channel, an RF gain switching signal designating selection of RF gain control signal bus 20 is combined with PLL frequency set data to be output from microprocessor 22 onto bus 23. By decoder 25, the RF gain switching signal is separated and output to RF gain control signal switching circuit 21. RF gain control signal switching circuit 21 selects RF gain control signal bus 20 to output the RF gain control signal output from AGC detector circuit 18 related to digital demodulation to RF gain control circuit 2.

The above description is based on a structure in which decoder 25, PLL circuit 5 and RF gain control signal switching circuit 21 are arranged in close proximity to each other. However, these circuits may be configured on one IC (Integrated Circuit). In this case, it is no longer necessary to lay out the signal lines among such circuits. Therefore, noise influence can be minimized.

According to digital/analog common tuner 100 of the first embodiment, the analog signal process related circuit and bus through which an analog signal is transmitted, vulnerable to noise, are electromagnetically shielded from the digital signal process related circuit and bus through which a digital signal is transmitted. Therefore, degradation in the S/N ratio related to analog signal processing, caused by noise generated from the digital signal process related circuit and bus through which a digital signal is transmitted, can be suppressed. Stable reception properties can be achieved.

According to the digital/analog common tuner 100 of the first embodiment, the signal and data to be output are combined into one data and transmitted through one bus. Therefore, only one I/O port for microprocessor 22 is necessary. Restriction on the microprocessor such as adopting a microprocessor with a plurality of I/O ports can be eliminated. Therefore, the increase in cost of the microprocessor can be suppressed. Also, reduction in the number of buses provides the advantage of reducing the noise generation source as well as reducing the design cost by simplifying the circuit design.

Second Embodiment

Figure 3:
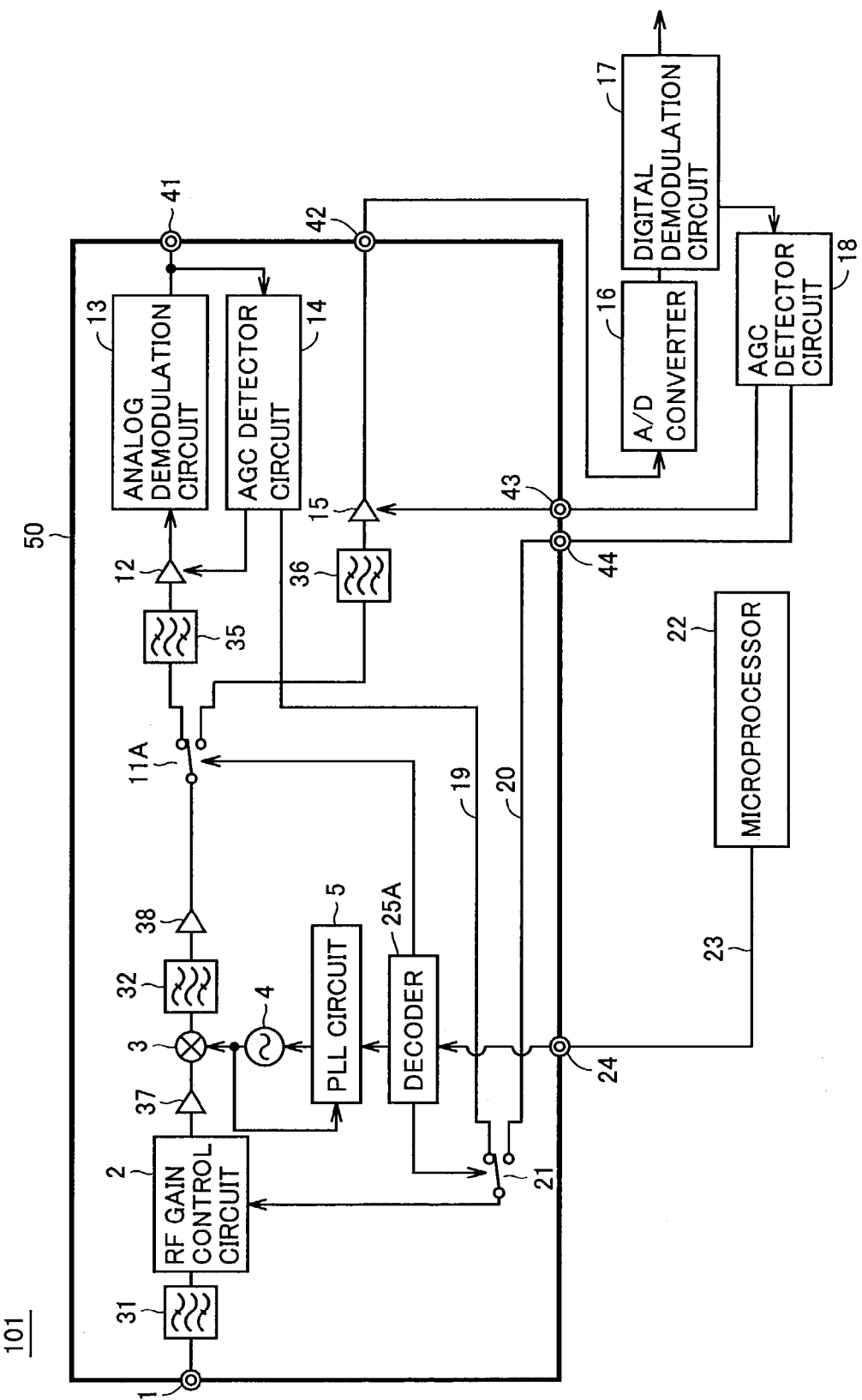
FIGS. 3 and 4 are functional block diagrams to describe the function of a digital/analog common tuner according to a second embodiment and a third embodiment, respectively, of the present invention.

Referring to FIG. 3, a digital/analog common tuner 101 according to a second embodiment of the present invention differs from digital/analog common tuner 100 of the first embodiment in that an IF signal switching circuit 11A and a decoder 25A are provided instead of IF signal distribution circuit 11 and decoder 25.

IF signal switching circuit 11A receives from decoder 25A an IF switching signal to switch the transmission destination of an IF signal. The transmission of an IF signal is switched between the system that performs analog demodulation processing and the system that performs digital demodulation processing.

Decoder 25A receives via bus 23 and terminal 24 combined data of an RF gain switching signal, PLL frequency set data, and IF switching signal to separate the received combined signal into respective signals and data. Decoder 25A outputs the RF gain switching signal to RF gain control signal switching circuit 21, the PLL frequency set data to PLL circuit 5, and the IF switching signal to IF signal switching circuit 11A.

Decoder 25A, PLL circuit 5 and RF gain control signal switch circuit 21 are arranged in close proximity to each other, likewise the first embodiment.

The IF switching signal is set by microprocessor 22. Microprocessor 22 determines whether the reception is analog broadcast or digital broadcast based on the reception channel, and outputs an IF switching signal to switch the transmission destination of the IF signal at IF signal switching circuit 11A according to the type of the received RF signal.

In digital/analog common tuner 101 of the second embodiment, the IF switching signal is combined as one data together with an RF gain switching signal and PLL frequency set data for output from microprocessor 22 to be provided onto bus 23 from one I/O port. The combined data takes a data structure as shown in FIG. 2. The IF switching signal is set to one of the switch control data of which at least two bits are reserved.

In digital/analog common tuner 101, the circuits and processes related to the frequency conversion of converting an RF signal into an IF signal, the analog demodulation and digital demodulation, and the gain switching in the RF gain control circuit are identical to those of digital/analog common tuner 100.

In the case of analog broadcast reception at digital/analog common tuner 101, microprocessor 22 combines the RF gain switching signal designating selection of RF gain control signal bus 19, the PLL frequency set data, and the IF switching signal designating transmission of the IF signal to the analog demodulation system based on the reception signal, and outputs the combined data onto bus 23. Then, decoder 25A separates the combined data to provide the IF switching signal to IF switching circuit 11A. IF switching circuit 11A provides the IF signal to the analog demodulation system based on the IF switching signal.

In the case of digital broadcast reception, microprocessor 22 combines an RF gain switching signal designating selection of RF gain control signal bus 20, PLL frequency set data, and an IF switching signal designating transmission of the IF signal to the digital demodulation system based on the reception signal, and provides the combined data onto bus 23. Then, the IF switching signal separated by decoder 25A is provided to IF switching circuit 11A. IF switching circuit 11A provides the IF signal to the digital demodulation system based on the IF switching signal.

For the reason similar to that described in the first embodiment, decoder 25A, PLL circuit 5, and RF gain control signal switching circuit 21 may be configured on one IC.

According to digital/analog common tuner 101 of the second embodiment, microprocessor 22 combines the signal and data to be output as one data via one bus as in the first embodiment, even if there is an additional signal to be output. Therefore, microprocessor 22 requires only one I/O port. The restriction on the microprocessor such as the requirement to adopt a microprocessor including a plurality of I/O ports is eliminated. Thus, likewise digital/analog common tuner 100 of the first embodiment, the increase in cost of the microprocessor can be suppressed. Also, reduction in the number of buses provides the advantage of reducing the noise generation source as well as reducing the design cost by simplifying the circuit design.

Electromagnetic shielding is effected in digital/analog common tuner 101 of the second embodiment, likewise the first embodiment. Therefore, noise resistance is achieved as in the first embodiment. Stable reception properties can be achieved.

Third Embodiment

The digital/analog common tuner of the third embodiment is directed to digital/analog common tuner 100 of the first embodiment, employing the double conversion scheme.

Figure 4:
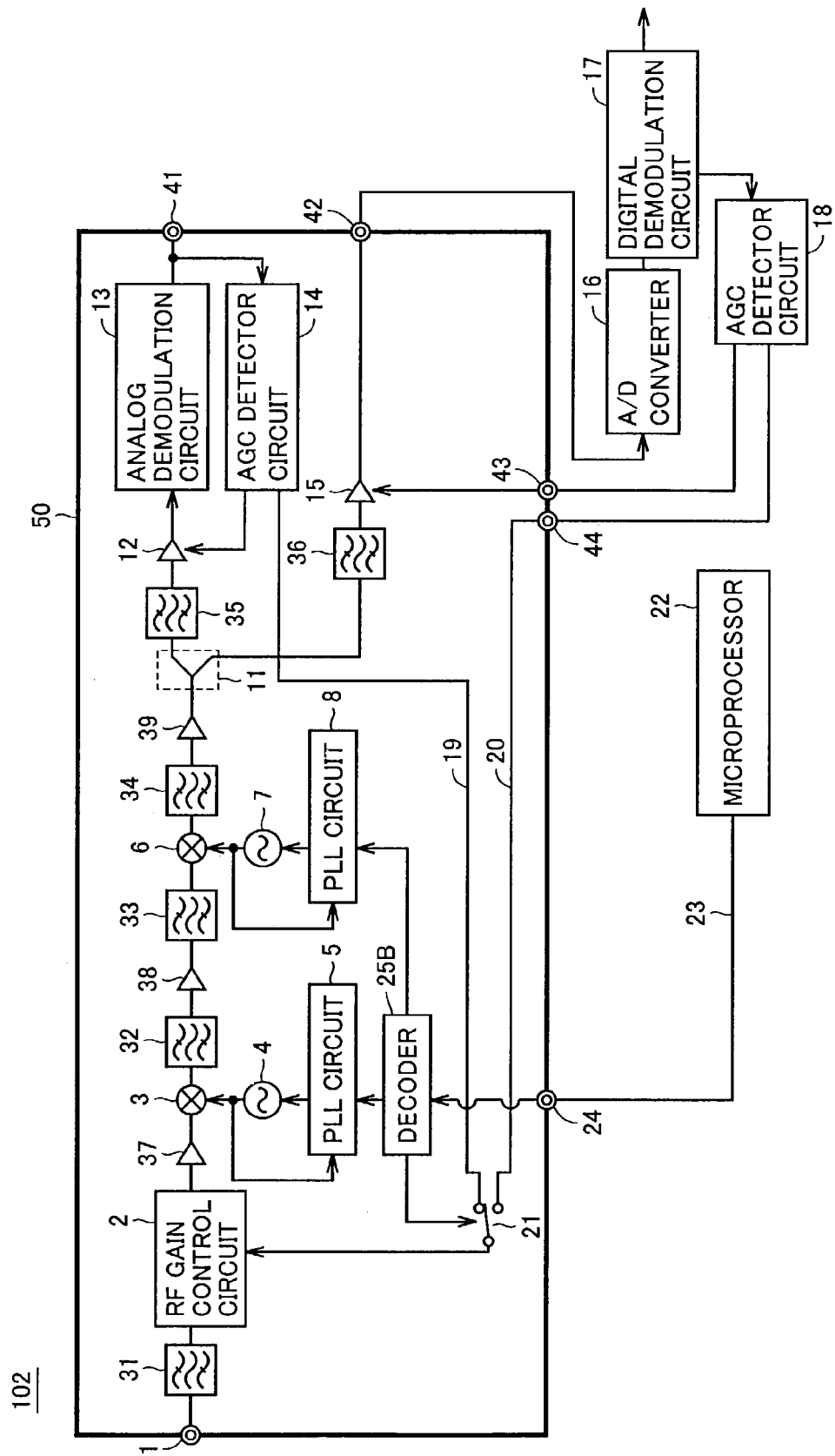

Referring to FIG. 4, a digital/analog common tuner 102 according to the third embodiment includes a second frequency conversion unit with a mixer circuit 6, a local oscillator 7 and a PLL circuit 8, bandpass filters 33 and 34, and an amplifier circuit 39, in addition to the circuits of digital/analog common tuner 100 of the first embodiment.

Digital/analog common tuner 102 includes a decoder 25B instead of decoder 25 employed in digital/analog common tuner 100 of the first embodiment.

According to the third embodiment, the RF signal input from RF signal input terminal 1 is converted by mixer circuit 3, local oscillator 4 and PLL circuit 5 of the first frequency conversion unit into a first IF signal of a frequency higher than that of the desired IF signal, based on first PLL frequency set data set by microprocessor 22 according to the reception channel.

Mixer circuit 6, local oscillator 7 and PLL circuit 8 are circuits directed to convert the first IF signal into a desired IF signal. Mixer circuit 6 mixes the first IF signal with a local oscillator signal output from local oscillator circuit 7 to convert into the desired IF signal. Local oscillator 7 provides a local oscillator signal to mixer circuit 6 under control of PLL circuit 8, and also feeds back the output local oscillator signal to PLL circuit 8. PLL circuit 8 controls local oscillator 7 based on second PLL frequency set data set by microprocessor 22 according to the reception channel.

Mixer circuit 6, local oscillator 7 and PLL circuit 8 of the second frequency conversion unit are provided on the same substrate as mixer circuit 3, local oscillator 4 and PLL circuit 5 of the first frequency conversion unit. Both frequency conversion units must be sufficiently isolated from each other, and are disposed on the substrate with appropriate spacing.

Bandpass filters 33 and 34 are filters passing through signals of only a predetermined frequency band in order to remove any noise component overlapped on the signal. Amplifier circuit 39 amplifies a signal by a predetermined level for output. The IF signal frequency-converted by the second frequency conversion unit is filtered by bandpass filter 34, amplified by a predetermined amount at amplifier circuit 39, and applied to IF signal distribution circuit 11.

Decoder 25B receives from microprocessor 22 combined data of an RF gain switching signal and first and second PLL frequency set data via bus 23 and terminal 24 to separate the combined data into respective signals and data. Decoder 25B provides the RF gain switching signal to RF gain control signal switching circuit 21, the first PLL frequency set data to PLL circuit 5, and the second PLL frequency set data to PLL circuit 8.

The RF gain switching signal and first and second PLL frequency set data, when output from microprocessor 22, are combined into one data and output onto bus 23 from one I/O port, as in the previous embodiments.

Decoder 25B shown in FIG. 4 is arranged in the neighborhood of PLL circuit 5 together with RF gain control signal switching circuit 21. As mentioned previously, it is desirable to dispose decoder 25B and RF gain control signal switching circuit 21 in the neighborhood of the frequency conversion unit (PLL circuit). In digital/analog common tuner 102, decoder 25B and RF gain control signal switching circuit 21 are disposed in the proximity of PLL circuit 5 of the first frequency conversion unit since the first and second frequency conversion units must be sufficiently isolated from each other according to the double conversion architecture.

Figure 5:
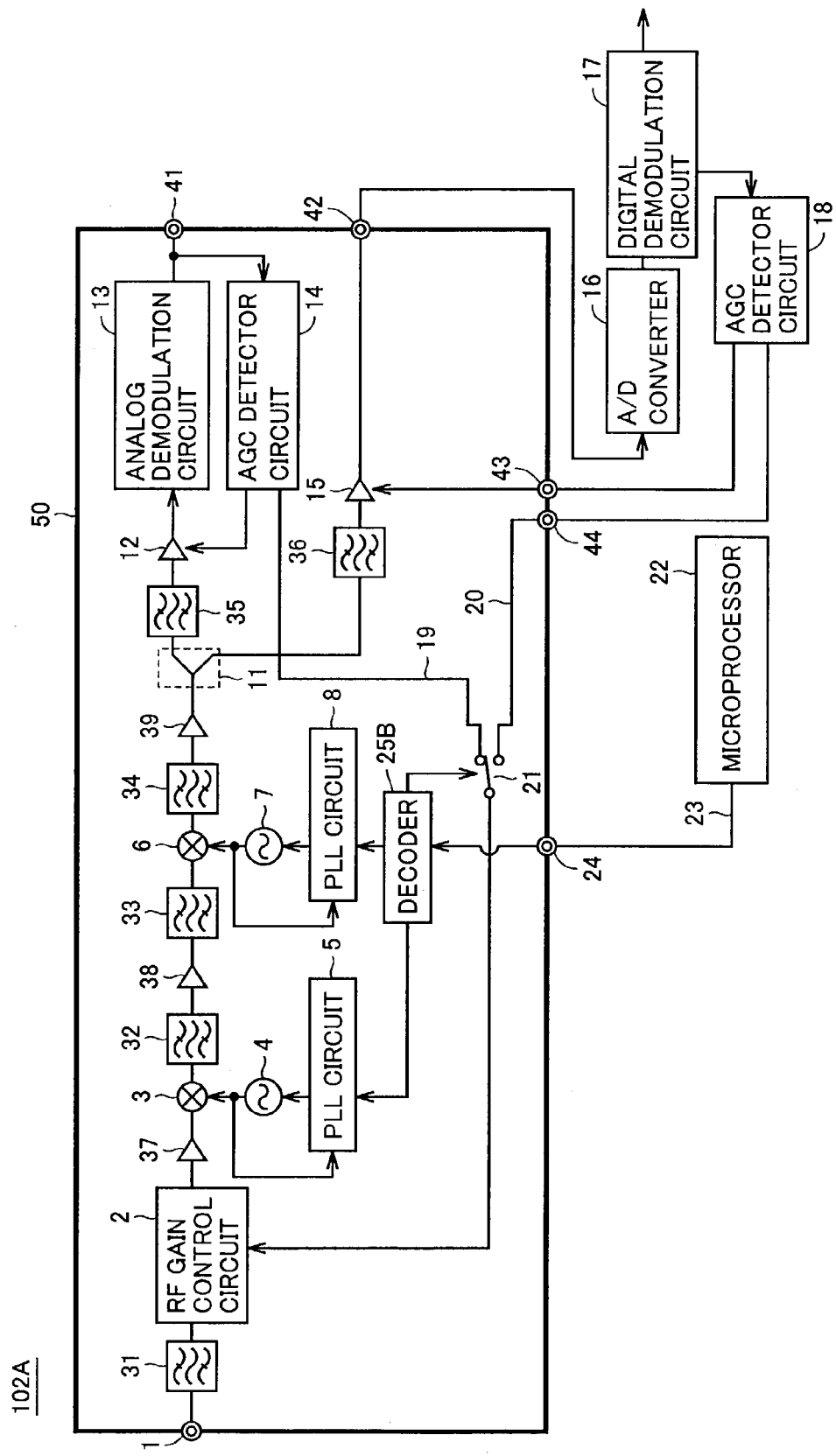
FIG. 5 is a functional block diagram to describe a modification of the digital/analog common tuner of FIG. 4.

In a digital/analog common tuner 102A shown in FIG. 5, decoder 25B and RF gain control signal switching circuit 21 are disposed in the proximity of PLL circuit 8 of the second frequency conversion unit. Determination of which of PLL circuit 5 or 8 is to be selected for disposing decoder 25B in the neighborhood is made depending upon whether sufficient isolation can be achieved based on the arrangement of other circuits and buses.

Referring to FIG. 4 again, the circuits and processes related to analog demodulation, digital demodulation, and gain switching of the RF gain control circuit in digital/analog common tuner 102 are similar to those of digital/analog common tuner 100.

In digital/analog common tuner 102, frequency conversion is performed two times to convert an RF signal into an IF signal. At the first frequency conversion unit including mixer circuit 3, local oscillator 4 and PLL circuit 5, the RF signal is up-converted into a first IF signal higher in frequency than the desired IF frequency based on the first PLL frequency set data set by microprocessor 22. At the second frequency conversion unit including mixer circuit 6, local oscillator 7 and PLL circuit 8, the first IF signal is down-converted into the desired IF signal based on the second PLL frequency set data set by microprocessor 22.

Microprocessor 22 combines RF gain switching signal designating the selection of either RF gain control signal bus 19 or 20 with first and second PLL frequency set data based on the reception channel. The combined data is output onto bus 23. The first PLL frequency set data separated by decoder 25B is output to PLL circuit 5. The second PLL frequency set data is output to PLL circuit 8.

Decoder 25B, PLL circuit 5, and RF gain control signal switching circuit 21 may be configured on one IC, likewise the first embodiment. Also, in digital/analog common tuner 102A of FIG. 5, decoder 25B, PLL circuit 8 and RF gain control signal switching circuit 21 may be configured on one IC. The reason is as described in the first embodiment.

According to digital/analog common tuners 102 and 102A of the third embodiment, the analog signal process related circuit and bus through which an analog signal is transmitted, vulnerable to noise, are shielded electromagnetically from the digital signal process related circuit and bus through which a digital signal is transmitted. Also, sufficient isolation is established between the first and second frequency conversion units in cabinet 50, and decoder 25B is disposed in the proximity of either PLL circuit 5 or 8. Therefore, the noise resistance of the analog signal processing system is improved to allow stable reception properties.

Fourth Embodiment

The digital/analog common tuner of the fourth embodiment is directed to digital/analog common tuner 102A of the double conversion scheme of the third embodiment, including an IF signal switching circuit 11A instead of IF signal distribution circuit 11.

Figure 6:
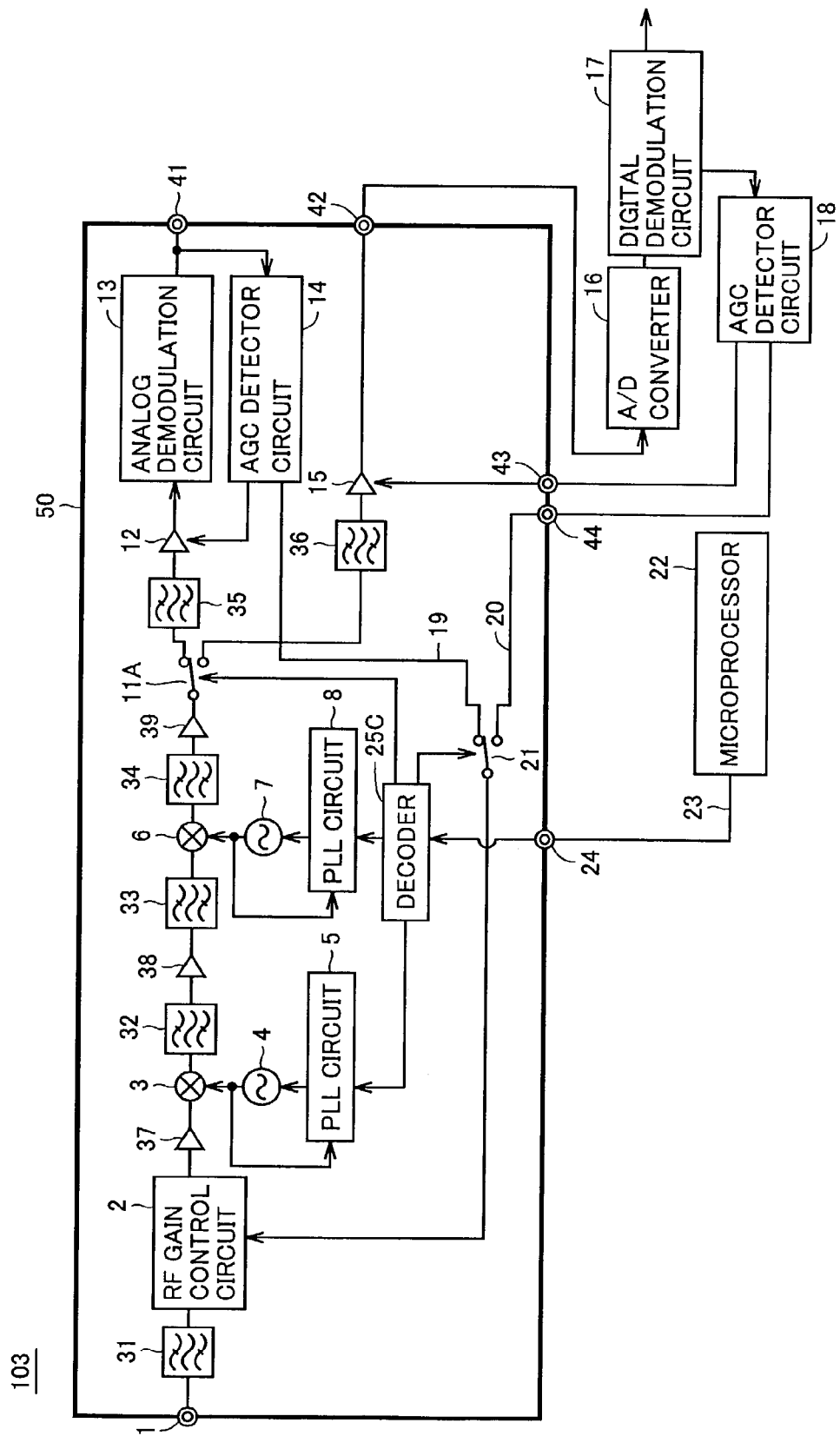
FIGS. 6 and 7 are functional block diagrams to describe the function of a digital/analog common tuner according to a fourth embodiment and a fifth embodiment, respectively, of the present invention.

Referring to FIG. 6, a digital/analog common tuner 103 of the fourth embodiment includes an IF signal switching circuit 11A and a decoder 25C instead of IF signal distribution circuit 11 and decoder 25B of digital/analog common tuner 102A of the third embodiment.

IF signal switching circuit 11A is similar to the circuit described in the second embodiment.

Decoder 25C receives the combined data of an RF gain switching signal, first and second PLL frequency set data and an IF switching signal via bus 23 and terminal 24 to separate the received combined data into the four signals and data. Decoder 25C outputs the RF gain switching signal to RF gain control signal switching circuit 21, the first and second PLL frequency set data to PLL circuits 5 and 8, respectively, and the IF switching signal to IF signal switching circuit 11A.

The IF switching signal is set by microprocessor 22, as in the second embodiment. Similarly in the present fourth embodiment, the IF switching signal is combined into one data together with the RF gain switching signal and first and second PLL frequency set data when output from microprocessor 22 to be provided onto bus 23 from one I/O port.

In digital/analog common tuner 103, the circuits and processes related to frequency conversion of converting an RF signal into an IF signal, analog demodulation and digital demodulation, and gain switching of the RF gain control circuit are similar to those of digital/analog common tuner 102A of the third embodiment.

In the case of analog broadcast reception in digital/analog common tuner 103, microprocessor 22 combines into one data the four signals and data, i.e. an RF gain switching signal designating selection of RF gain control signal bus 19, first and second PLL frequency set data, and an IF switching signal designating transmission of the IF signal to the system of analog demodulation processing, and provides the combined data onto bus 23. The combined data is received at decoder 25C via terminal 24. The IF switching signal separated by decoder 25C is output to IF switching circuit 11A. IF switching circuit 11A provides the IF signal to the system that performs analog demodulation processing based on the IF switching signal.

In the case of digital broadcast reception, microprocessor 22 combines the four signals and data, i.e. an RF gain switching signal designating selection of RF gain control signal bus 20, first and second PLL frequency set data and an IF switching signal designating transmission of the IF signal to the system performing digital demodulation processing, as one data based on the reception channel for output onto bus 23. At decoder 25C, a process similar to that in analog broadcast reception is carried out. IF switching circuit 11A provides the IF signal to the system that performs digital demodulation processing based on the IF switching signal received from decoder 25C.

As described in each of the above embodiments, decoder 25C, PLL circuit 8 and RF gain control signal switching circuit 21 may be configured on one IC. The reason thereof is as described in the first embodiment.

Although not shown, decoder 25C and RF gain control signal switching circuit 21 may be disposed in the proximity of PLL circuit 5 of the first frequency conversion unit. Determination of which of PLL circuit 5 or 8 is to be selected for disposing decoder 25C and RF gain control signal switching circuit 21 in the neighborhood is made depending upon whether sufficient isolation can be established according to the arrangement of other circuits and buses.

Correspondingly, decoder 25C, PLL circuit 5 and RF gain control signal switching circuit 21 may be configured on one IC.

Digital/analog common tuner 103 of the fourth embodiment employs the double conversion scheme and includes an IF signal switching circuit 11A. No matter how many signals are output from microprocessor 22, microprocessor 22 combines the signals and data to be output as one data and transmitted via one bus 23. Therefore, only one I/O port is necessary for microprocessor 22. Restriction on the microprocessor such as adopting a microprocessor with a plurality of I/O ports can be eliminated. Therefore, the increase in cost of the microprocessor can be suppressed. Also, reduction in the number of buses provides the advantage of reducing the noise generation source as well as reducing the design cost by simplifying the circuit design.

According to digital/analog common tuner 103 of the fourth embodiment, electromagnetic shielding is effected as in the previous embodiments. Therefore, degradation in the S/N ratio related to analog signal processing, caused by noise generated from the digital signal process related circuit and bus through which a digital signal is transmitted, can be suppressed. Stable reception properties can be achieved.

Fifth Embodiment

The fifth embodiment is directed to a digital/analog common tuner of the double conversion scheme with a decoder arranged in the proximity of each of two PLL circuits. Accordingly, the length of the signal lines among respective circuits can be further reduced. Thus, the noise effect between respective signal lines and circuits can be further suppressed.

Figure 7:
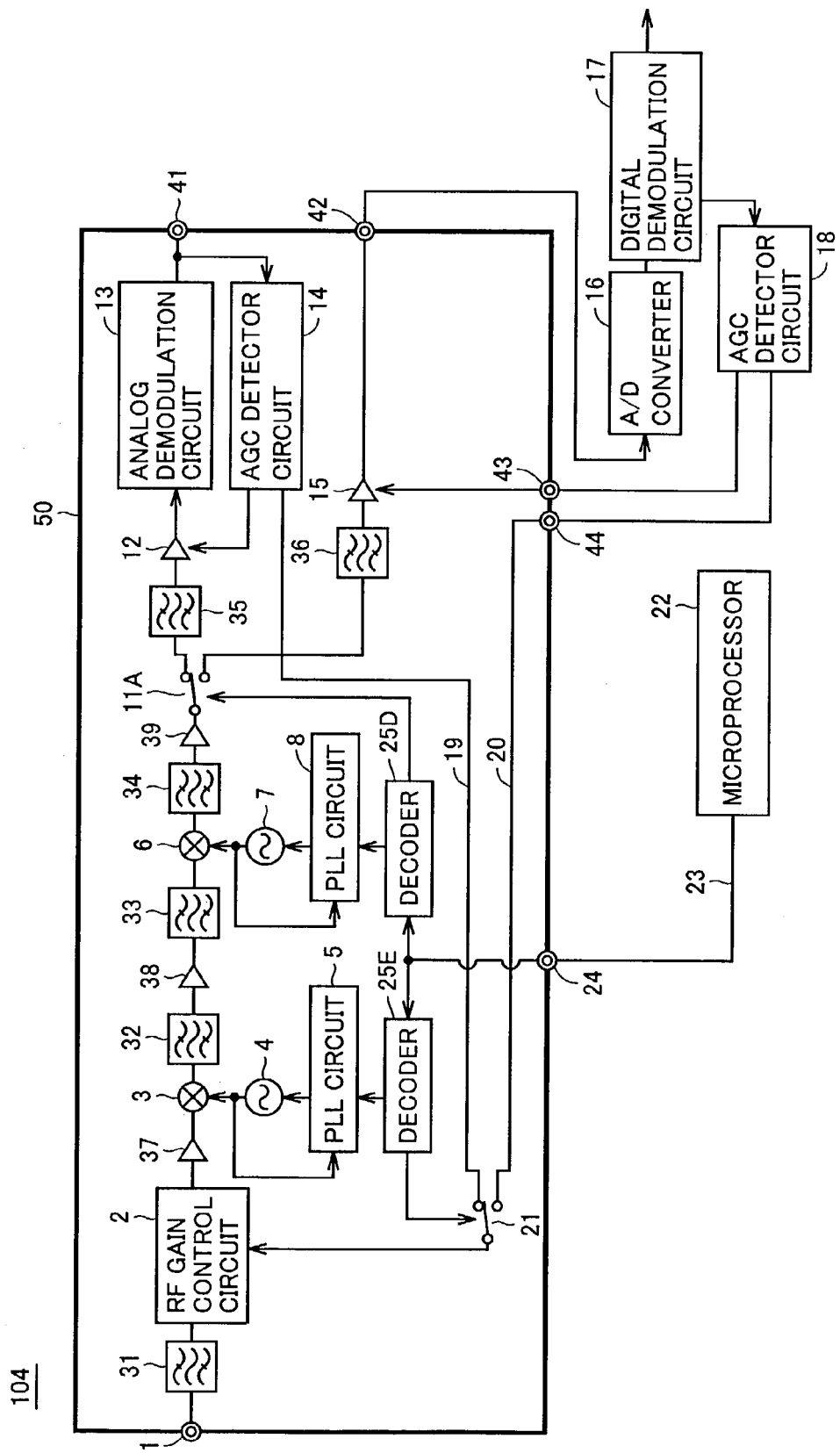
Figure 8:
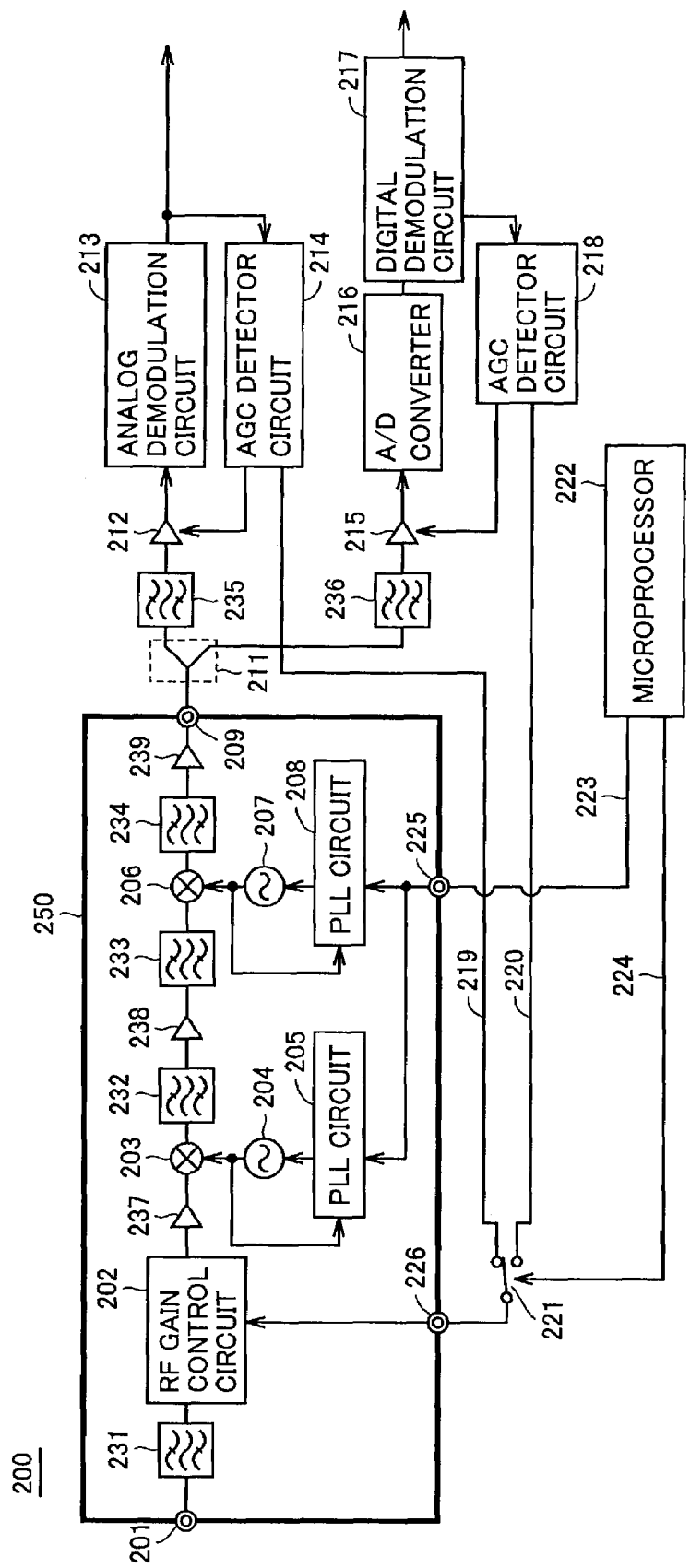
FIG. 8 is a functional block diagram to describe the function of a conventional digital/analog common tuner.

Referring to FIG. 7, a digital/analog common tuner 104 according to the fifth embodiment includes a decoder 25D instead of decoder 25C, and further includes a decoder 25E, based on digital/analog common tuner 103 of the fourth embodiment.

Decoder 25D arranged in the proximity of PLL circuit 8 receives via bus 23 and terminal 24 the combined data of an RF gain switching signal, first and second PLL frequency set data and an IF switching signal, and separates the second PLL frequency set data and the IF switching signal from the combined data. Decoder 25D outputs the second PLL frequency set data to PLL circuit 8 and the IF switching signal to IF signal switching circuit 11A.

Decoder 25E disposed in the proximity of PLL circuit 5 together with RF gain control signal switching circuit 21 receives via bus 23 and terminal 24 the combined data of an RF gain switching signal, first and second PLL frequency set data and an IF switching signal, and separates the first PLL frequency set data and RF gain switching signal from the combined data. Decoder 25E outputs the first PLL frequency set data to PLL circuit 5 and the RF gain switching signal to RF gain control signal switching circuit 21.

The combination of the four signals and data, i.e., the RF gain switching signal, first and second PLL frequency set data and IF switching signal, into one data and output from microprocessor 22 onto one bus 23 are similar to those described in the fourth embodiment.

Also, determination of reception of either analog or digital broadcast depending on the reception channel by microprocessor 22 to switch RF gain control signal switching circuit 21 and IF switching circuit 11A based on the RF gain switching signal and IF switching signal set by microprocessor 22 are as described in the fourth embodiment.

Decoder 25D and PLL circuit 8 may be configured on one IC. Also, decoder 25E, PLL circuit 5 and RF gain control signal switching circuit 21 may be configured on one IC. The reason thereof is as described in the first embodiment.

According to digital/analog common tuner 104 of the fifth embodiment, microprocessor 22 combines signals and data to be output as one data, and the two decoders 25D and 25E that receive and separate the combined data are disposed so that the layout of the signal lines on the substrate is reduced to the minimum. Therefore, the influence of noise between respective signal lines and circuits can be minimized. Thus, the noise resistance is further improved, and stable reception properties of higher level can be achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A digital/analog common tuner that can receive both a first television signal modulated digitally and a second television signal modulated analogically, comprising:
    a frequency conversion circuit frequency-converting an input signal into an intermediate frequency signal;
    a digital demodulation processing circuit converting a first intermediate frequency signal that is said first television signal frequency-converted by said frequency conversion circuit into a digital signal and demodulating said digital signal; and
    an analog demodulation processing circuit demodulating a second intermediate frequency signal that is said second television signal frequency-converted by said frequency conversion circuit,
    wherein said frequency conversion circuit and said analog demodulation processing circuit are accommodated in a cabinet that functions as electromagnetic shielding, whereby the digital demodulation processing circuit is excluded from the electromagnetic shielding cabinet.

2. The digital/analog common tuner according to claim 1, further comprising:
    an input signal gain control circuit controlling a gain based on one of a first gain control signal output from said analog demodulation processing circuit and a second gain control signal output from said digital demodulation processing circuit;
    a gain control signal switching circuit receiving said first and second gain control signals and selecting one of said first and second gain control signals to output to said input signal gain control circuit;
    a control circuit combining a gain switching signal used to switch between said first gain control signal and said second gain control signal, and frequency set data used to frequency-convert said input signal into said intermediate frequency signal at said frequency conversion circuit to output as digital data;
    a bus through which data combined by said control circuit for output is transmitted; and
    a decoder receiving and separating said combined data into said gain switching signal and said frequency set data to output said gain switching signal to said gain control signal switching circuit and to output said frequency set data to said frequency conversion circuit,
    wherein said input signal gain control circuit, said gain control signal switching circuit, and said decoder are also accommodated in said cabinet.

3. The digital/analog common tuner according to claim 2, wherein said frequency conversion circuit includes
    a local oscillator generating a local oscillator signal;
    a PLL circuit controlling said local oscillator based on said frequency set data; and
    a mixer circuit mixing said input signal with said local oscillator signal to frequency-convert into said intermediate frequency signal.

4. The digital/analog common tuner according to claim 2, wherein said decoder and said gain control signal switching circuit are disposed in a neighborhood of said frequency conversion circuit.

5. The digital/analog common tuner according to claim 2, wherein said frequency conversion circuit includes
- a first frequency conversion circuit converting said input signal into a predetermined frequency signal; and
- a second frequency conversion circuit converting said predetermined frequency signal into said intermediate frequency signal.

6. The digitallanalog common tuner according to claim 2, wherein said frequency conversion circuit includes
- a first frequency conversion circuit converting said input signal into a predetermined frequency signal; and
- a second frequency conversion circuit converting said predetermined frequency signal into said intermediate frequency signal, wherein
- said frequency set data output from said control circuit includes as first frequency set data used to frequency-convert said input data into said predetermined frequency signal, and second frequency set data used to frequency-convert said predetermined frequency signal into said intermediate frequency signal,
- said decoder further separates said combined data into said first and second frequency set data to output said first frequency set data to said first frequency conversion circuit and to output said second frequency set data to said second frequency conversion circuit.

7. The digital/analog common tuner according to claim 1, further comprising a signal switching circuit selecting and outputting said intermediate frequency signal converted by said frequency conversion circuit to one of said digital demodulation processing circuit and said analog demodulation processing circuit,
- wherein said signal switching circuit is also accommodated in said cabinet.

8. The digital/analog common tuner according to claim 7, further comprising:
- an input signal gain control circuit controlling a gain based on one of a first gain control signal output from said analog demodulation processing circuit and a second gain control signal output from said digital demodulation processing circuit;
- a gain control signal switching circuit receiving said first and second gain control signals and selecting one of said first and second gain control signals to output to said input signal gain control circuit;
- a control circuit combining a gain switching signal used to switch between said first and second gain control signals, frequency set data used to frequency-convert said input signal into said intermediate frequency signal at said frequency conversion circuit, and an IF switching signal used to switch a transmission destination at said signal switching circuit for output as digital data;
- a bus through which data combined by said control circuit for output is transmitted; and
- a decoder receiving and separating said combined data into said gain switching signal, said frequency set data, and said IF switching signal to output said gain switching signal to said gain control signal switching circuit, to output said frequency set data to said frequency conversion circuit, and to output said IF switching signal to said signal switching circuit,
- wherein said input signal gain control circuit, said gain control signal switching circuit, and said decoder are also accommodated in said cabinet.

9. The digital/analog common tuner according to claim 8, wherein said frequency conversion circuit includes
- a local oscillator generating a local oscillator signal;
- a PLL circuit controlling said local oscillator based on said frequency set data; and
- a mixer circuit mixing said input signal with said local oscillator signal for frequency-converting into said intermediate frequency signal.

10. The digitalanalog common tuner according to claim 8, wherein said decoder and said gain control signal switching circuit are disposed in a neighborhood of said frequency conversion circuit.

11. The digitahlanalog common tuner according to claim 8, wherein said frequency conversion circuit includes
- a first frequency conversion circuit converting said input signal into a predetermined frequency signal; and
- a second frequency conversion circuit converting said predetermined frequency signal into said intermediate frequency signal.

12. The digital/analog common tuner according to claim 8, wherein said frequency conversion circuit includes
- a first frequency conversion circuit converting said input signal into a predetermined frequency signal; and
- a second frequency conversion circuit converting said predetermined frequency signal into said intermediate frequency signal, wherein
- said frequency set data output from said control circuit includes first frequency set data used to frequency-convert said input signal into said predetermined frequency signal, and second frequency set data used to frequency-convert said predetermined frequency signal into said intermediate frequency signal,
- said decoder further separates said combined data into said first and second frequency set data to output said first frequency set data to said first frequency conversion circuit and to output said second frequency set data to said second frequency conversion circuit.

13. The digitallanalog common tuner according to claim 12, wherein said decoder and said gain control signal switching circuit are disposed in a neighborhood of one of said first frequency conversion circuit and said second frequency conversion circuit.

14. The digital/analog common tuner according to claim 8, wherein said frequency conversion circuit includes
- a first frequency conversion circuit converting said input signal into a predetermined frequency signal; and
- a second frequency conversion circuit converting said predetermined frequency signal into said intermediate frequency signal, wherein
- said frequency set data output from said control circuit includes first frequency set data used to frequency-convert said input signal into said predetermined frequency signal, and second frequency set data used to frequency-convert said predetermined frequency signal into said intermediate frequency signal,
- said decoder includes a first decoder disposed in a neighborhood of a first PLL circuit included in said first frequency conversion circuit, and a second decoder disposed in a neighborhood of a second PLL circuit included in said second frequency conversion circuit,
- said first decoder receives said combined data from said bus and separates said combined data into said first frequency set data and said gain switching signal to output said first frequency set data to said first PLL circuit and to output said gain switching signal to said gain control signal switching circuit,
- said second decoder receives said combined data from said bus and separates said combined data into said second frequency set data and said IF switching signal to output said second frequency set data to said second PLL circuit and to output said IF switching signal to said signal switching circuit.

15. The digitallanalog common tuner according to claim 1, wherein said frequency conversion circuit includes
   a first frequency conversion circuit converting said input signal into a predetermined frequency signal; and
   a second frequency conversion circuit converting said predetermined frequency signal into said intermediate frequency signal.

16. A digital/analog common tuner that can receive both a first television signal modulated digitally and a second television signal modulated analogically, comprising:
   a frequency conversion circuit frequency-converting an input signal into an intermediate frequency signal;
   an input signal gain control circuit controlling a gain based on one of a first gain control signal used when said input signal is said first television signal and a second gain control signal used when said input signal is said second television signal;
   a gain control signal switching circuit receiving said first and second gain control signals and selecting one of said first and second gain control signals to output to said input signal gain control circuit;
   a control circuit combining a gain switching signal used to switch between said first and second gain control signals, and frequency set data used to frequency-convert said input signal into said intermediate frequency signal at said frequency conversion circuit for output as digital data;
   a bus through which data combined by said control circuit for output is transmitted; and
   a decoder receiving and separating said combined data into said gain switching signal and said frequency set data to output said gain switching signal to said gain control signal switching circuit and to output said frequency set data to said frequency conversion circuit.

17. The digital/analog common tuner according to claim 16, wherein said frequency conversion circuit includes
   a local oscillator generating a local oscillator signal;
   a PLL circuit controlling said local oscillator based on said frequency set data; and
   a mixer circuit mixing said input signal with said local oscillator signal to frequency-convert into said intermediate frequency signal.

18. The digital/analog common tuner according to claim 16, wherein said decoder and said gain control signal switching circuit are disposed in a neighborhood of said frequency conversion circuit.

19. The digital/analog common tuner according to claim 16, wherein said frequency conversion circuit includes
   a first frequency conversion circuit converting said input signal into a predetermined frequency signal; and
   a second frequency conversion circuit converting said predetermined frequency signal into said intermediate frequency signal.

20. The digitallanalog common tuner according to claim 16, wherein said frequency conversion circuit includes
   a first frequency conversion circuit converting said input signal into a predetermined frequency signal; and
   a second frequency conversion circuit converting said predetermined frequency signal into said intermediate frequency signal, wherein
   said frequency set data output from said control circuit includes first frequency set data used to frequency-convert said input data into said predetermined frequency signal, and second frequency set data used to frequency-convert said predetermined frequency signal into said intermediate frequency signal,
   said decoder further separates said combined data into said first and second frequency set data to output said first frequency set data to said first frequency conversion circuit and to output said second frequency set data to said second frequency conversion circuit.

* * * * *